United States Patent
Rhee

(12)
(10) Patent No.: US 6,854,082 B1
(45) Date of Patent: Feb. 8, 2005

(54) UNEQUAL ERROR PROTECTION REED-MULLER CODE GENERATOR AND DECODER

(75) Inventor: Dojun Rhee, Seoul (KR)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/994,556

(22) Filed: Nov. 27, 2001

(Under 37 CFR 1.47)

(51) Int. Cl.[7] ..................... H03M 13/29; H03M 13/35; H03M 13/45
(52) U.S. Cl. ........................................ 714/755; 714/780
(58) Field of Search .................................. 714/780, 755

(56) References Cited

U.S. PATENT DOCUMENTS 5,926,488 A * 7/1999 Khayrallah .................. 714/752

OTHER PUBLICATIONS

Kabilafkas et al., "New Class of Double Inductive Binary Error Correcting Codes Based on the Class of Reed–Muller Codes", IEE Proceedings, vol. 135, Pt. F, No. 6, Dec. 1988, pp. 507–512.*

Hemmati, "Closest Coset Decoding of |u|u+v| Codes", IEEE Journal on Selected Areas in Communications, vol. 7, No. 6, Aug. 1989, pp. 982–988.*

Fossorier et al., "Weight Distribution for Closest Coset Decoding Decoding of |u|u+v| Constructed Codes", IEEE Transactions on Information Theory, vol. 43, No. 3, May 1997, pp. 1028–1030.*

* cited by examiner

Primary Examiner—Stephen M. Baker
(74) Attorney, Agent, or Firm—Conley, Rose & Tayon

(57) ABSTRACT

An unequal error protection Reed-Muller code and method for designing a generator matrix and decoder. A conventional RM code is concatenated with the combination of itself and a subcode of itself. The new generator matrix is decomposed to include empty submatrices. The resulting generator matrix allows parallel decoding of separate portions of the received code word vectors.

20 Claims, 2 Drawing Sheets

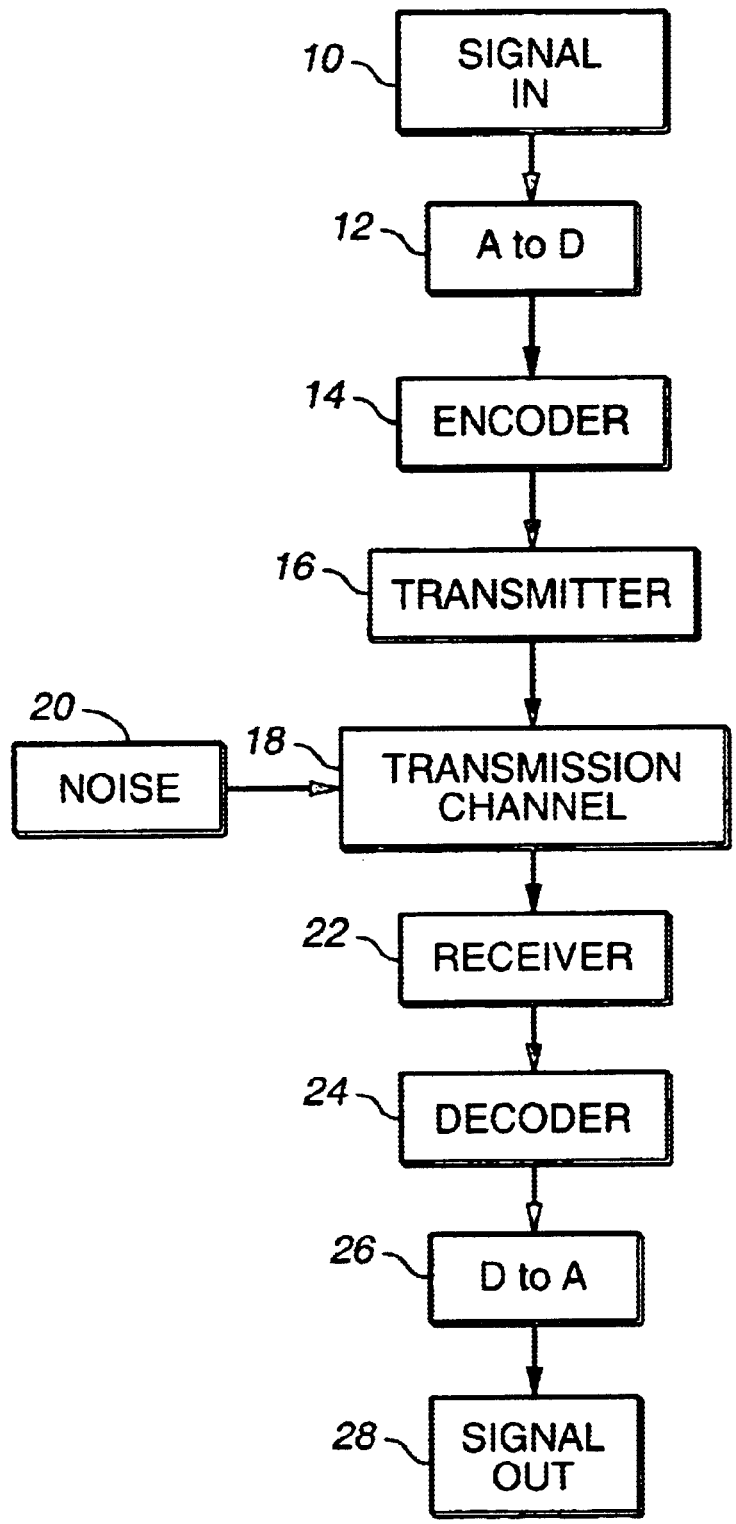
FIG._1

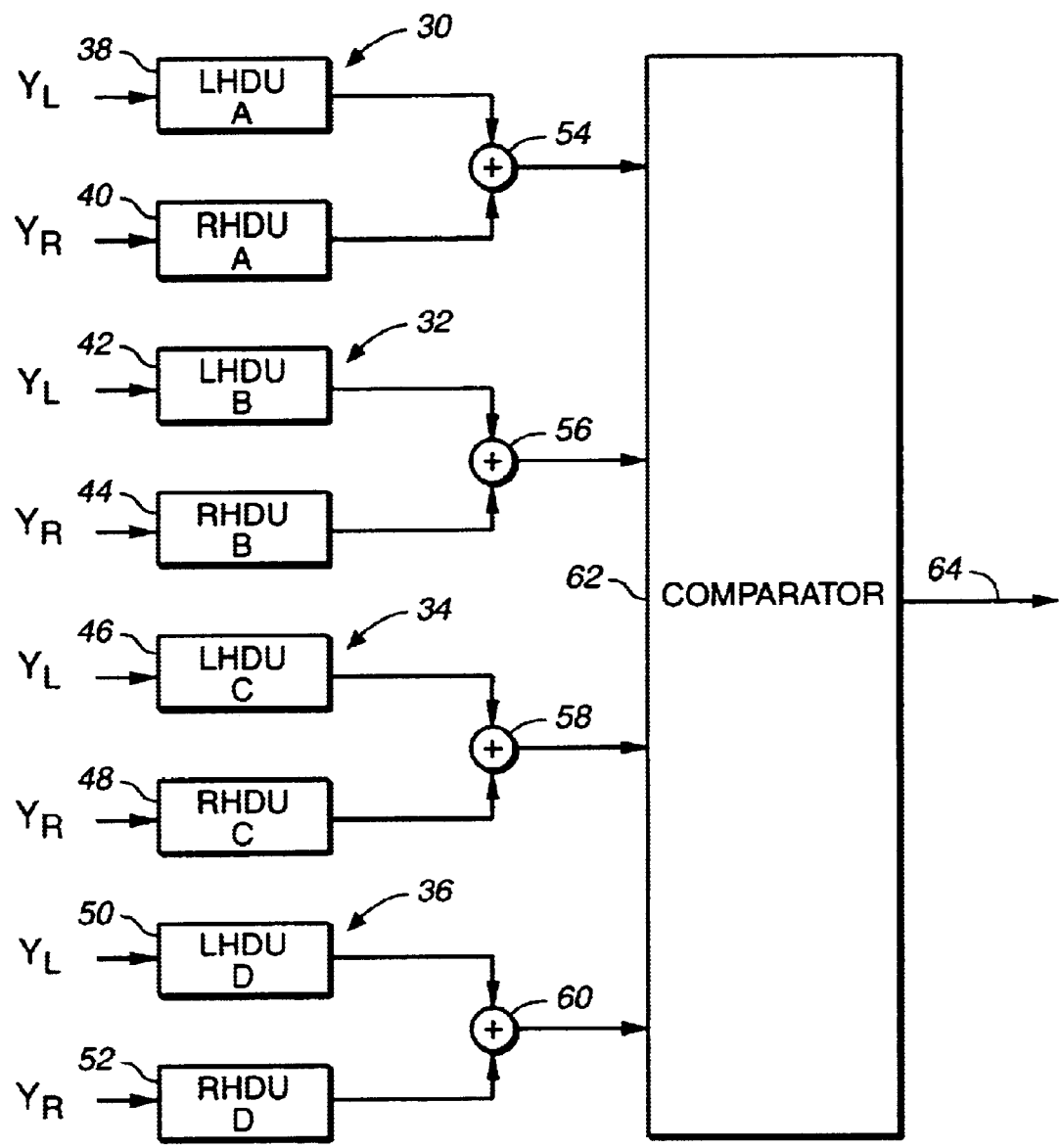
FIG._2

UNEQUAL ERROR PROTECTION REED-MULLER CODE GENERATOR AND DECODER

BACKGROUND OF THE INVENTION

The present invention relates to unequal error protection block codes and more particularly to a generator matrix for an unequal error protection Reed-Muller code and a decoder for such code.

Error protection codes are well known in systems which transmit information from one point to another or which record data on a storage medium for later playback. For example, pictures taken by a space probe must be transmitted back to Earth over long distances and with low power. The signals are therefore subject to interference by noise sources which cause the signal received on Earth to be different from the transmitted signal. By proper encoding of the signal before transmission, it is possible to reconstruct the original signal from the corrupted signal actually received. In similar fashion, information written onto a storage medium such as a compact disk is subject to errors in the writing process, errors caused by damage and wear to the disk and errors in the reading process. These errors are like noise sources in a transmission channel. But, by encoding the information before writing it to the storage medium, a certain level of errors can be corrected when the information is read from the disk.

Information to be error protected is typically digitized and transmitted or stored as a series of binary digits, bits, represented as ones and zeros. Each unit or word of data is usually represented by a fixed series of bits, e.g. eight or sixteen bits. Error codes generally add bits to the length of the data words to form code words which are transmitted or stored. For example, a repetition code may transmit or store a single "1" as four "1"s, which forms a 4,1 code (four bit codeword representing one bit of data). A decoder which receives a four bit word containing three "1"'s and one "0" would assume that one error occurred and four "1"s were transmitted and would decode the received code word as a single data bit of "1".

Coding increases the reliability of transmitted data. But, coding increases the bandwidth needed to transmit a given amount of data. Stated differently, coding reduces the amount of data which can be transmitted with a given bandwidth. Much effort has been made to design codes which most efficiently use available bandwidth and achieve the best level of error protection.

In real systems, all data does not need the same level of error protection. For example, in error protecting voice or music, it is more important to ptotect the most significant bits than the least significant bits. In some forms of video compression, images are broken into blocks which are represented by a number of parameters, one of which is the scale factor which applies to all other bits in the block. Any error in the scale factor causes an error in all other bits in the block. Thus, it is more important to protect the scale bits than the other bits. In such cases, unequal error protection codes can be used to optimize the coding system by using relatively more bandwidth to protect the more important bits and relatively less to protect less important bits.

The Reed-Muller codes are known to be efficient error protecting codes. However, when signals are encoded with a standard Reed-Muller generator matrix and decoded using standard algebraic decoding, the bit error rate for all bits is the same. It would be desirable to have a generator matrix for using Reed-Muller code to encode data with unequal error protection and a decoder which efficiently decodes the signals while maintaining the unequal error protection.

SUMMARY OF THE INVENTION

In accordance with the present invention, an unequal error protecting code is constructed by concatenating an original code with the sum of itself and a subcode of the original code. The resulting generator matrix provides unequal error protection. By proper decomposition, the generator matrix is simplified to a form which facilitates a simple decoding algorithm in which received code words are split into a plurality of parts which are decoded in parallel.

BRIEF DESCRIPTION OF THE DRAWINGS

FIG. 1 is a block diagram of a signal transmission system with error protection coding.

FIG. 2 is a block diagram of a signal decoder according to the present invention.

DETAILED DESCRIPTION OF EMBODIMENTS

FIG. 1 illustrates a typical data transmission system in which the present invention is useful. Block 10 represents an input signal, for example a voice, music or picture signal which normally originates as an analog signal. For instance, the input signal may be the output of a microphone in a cellular telephone. At block 12, the analog signal from block 10 is converted from analog to digital form. For example, an audio signal may be sampled and each sample may be represented by an eight or sixteen bit digital word. The digital signal from block 12 is coupled to an encoder 14 which provides forward error protection by converting each digital data word into a digital code word. The code words are then coupled to a transmitter 16 which may transmit the code words as radio frequency signals. The transmitted signals pass through a transmission channel 18, which may be the atmosphere of the Earth. Block 20 represents sources of noise or errors which cause the transmitted code words to be corrupted to some extent. At block 22, the transmitted signal plus noise are received and provided as a digital output to a decoder 24. The decoder 24 performs several functions. It detects errors in the received signal and, within certain limits, corrects the errors to identify the code word which was actually transmitted. When the proper codeword has been identified, it is mapped to the data word which would generate the code word in encoder 14. The digital data word is then coupled to a digital to analog converter 26 which may provide an analog output signal which is a good reproduction of the input signal from block 10.

As noted above, the system of FIG. 1 may also represent a system which records and plays back an audio or video signal. The transmitter 16 may be a system for writing, or burning, data onto a CD or a DVD. The receiver 22 may be a CD or DVD player which reads the recorded information from the CD or DVD. The transmission channel may be the CD or DVD itself. The noise 20 is from errors in the writing process, reading process, and from scratches on the surface of the CD or DVD caused by improper handling.

In similar fashion, the transmission channel may be digital subscriber lines and/or long distance backbone telephone systems or the Internet. In the case of the Internet, the transmitter and receiver may be personal computer systems. Any such systems can be affected by noise sources and therefore can benefit from use of error protection coding. Such systems typically can optimize the tradeoff of bandwidth and error protection by use of unequal error protection codes.

The present invention provides a new method for designing an unequal error protecting code generator for encoder 14. It also provides a method for designing a corresponding decoder 24 which provides fast parallel decoding and maintains the unequal error protection. To clarify this disclosure of the present invention, only the case of binary codes and relatively short data and code words are considered.

The basic process for encoding a digital data word d into a block code word C is by use of a generator matrix G, according to the equation:

$$[d][G]=[C]$$

The data word d is represented by a vector having a length k. The generator matrix G has k rows and n columns. The code words C have a length of n. As a starting point for the embodiment which is described in this disclosure, assume k is four and n is eight. The resulting generator equation then has the form:

$$[x\ x\ x\ x]\begin{bmatrix}x\ x\ x\ x\ x\ x\ x\ x\\ x\ x\ x\ x\ x\ x\ x\ x\\ x\ x\ x\ x\ x\ x\ x\ x\\ x\ x\ x\ x\ x\ x\ x\ x\end{bmatrix}=[x\ x\ x\ x\ x\ x\ x\ x]$$

In this embodiment each "x" represents a digital one or zero. The code, C, is the complete set of all code words which are generated by multiplying every possible data word, d, by the generator matrix, G. Since the data word in this embodiment has four bits, it has sixteen possible values. There are therefore sixteen code words in the code, C, out of the 256 possible eight-bit digital vectors.

In one embodiment of the present invention, a Reed-Muller block code generator matrix, G, which produces the code C is used as the starting point for designing an improved generator matrix. Any binary block code, C, has subcodes, one of which is represented here as $C_1$. A subcode may be generated by any linear combination of the rows of the original matrix G, which combination forms a subcode generator matrix $G_1$. The subcode $C_1$ has a number of rows $k_1$ which is less than k. In the present embodiment, we will pick $k_1$ to be two. As a result, the subcode generator matrix $G_1$ can encode only two data bits and the subcode $C_1$ includes only four code words. The generator matrix $G_1$ has the same number of columns as G and produces code words having a length of eight in this embodiment.

In the present invention, a new unequal error protection code $C_2$ is generated by concatenating the original code C generated by matrix G with the sum of the same code and the subcode $C_1$ generated by matrix $G_1$. This process is represented by the equation:

$$C_2 = |U|U+V|$$

where U is a code word of C and V is a codeword of $C_1$. The new generator matrix $G_2$ for code $C_2$, is represented by the equation;

$$[G_2] = \begin{matrix}[G\ \ G]\\ [0\ \ G_1]\end{matrix}$$

The generator matrix $G_2$ has more rows and more columns than matrix G. The additional rows are provided by $G_1$, which for this embodiment has two rows. $G_2$ therefore has six rows and can encode a data word of six bits. The matrix $G_2$ has sixteen columns and therefore generates code words which are sixteen bits long. In this embodiment, there are 64 code words in code $C_2$, one for each of the possible six bit data words.

Since $C_1$ is a subcode of C, we have the following coset decomposition of C:

$$C = C_1 + [C/C_1]$$

where $[C/C_1]$ denotes the sets of representatives of the cosets of $C_1$ in C. The generator matrix for the $[C/C_1]$ coset code is represented as $G_3$. The dimension, i.e. number of rows, of $G_3$ is $k_3$ which is equal to k minus $k_1$. Therefore, the generator matrix G for code C may be represented as:

$$[G] = \begin{matrix}[G_3]\\ [G_1]\end{matrix}$$

The generator matrix $G_2$ for code $C_2$ may therefore be rewritten as:

$$[G_2] = \begin{matrix}[G_3\ \ G_3]\\ [G_1\ \ G_1]\\ [0\ \ G_1]\end{matrix}$$

The linear operation of subtraction of one row from another does not change the nature of a code generator matrix. Therefore, by subtracting the last two rows of $G_2$ from the middle two rows of $G_2$, the matrix $G_2$ may also be rewritten as:

$$[G_2] = \begin{matrix}[G_3\ \ G_3]\\ [G_1\ \ 0]\\ [0\ \ G_1]\end{matrix}$$

In the present embodiment, each of the submatrices $G_3$ and $G_1$ have two rows and generator matrix $G_2$ has a total of six rows. The generator matrix $G_2$, is therefore designed to encode six bit words instead of the original four-bit data word d. The data vector $d_2$ for our new code $C_2$ is six bits long, four corresponding to the original code C and two corresponding to the subcode $C_1$. The data word $d_2$ can be divided into three parts for further explanation of the present invention as follows:

$$[d_2]=[d_a|d_b|d_c]$$

The new code $C_2$ is generated according to the following equation:

$$[d_a|d_b|d_c] \times \begin{matrix}[G_3\ \ G_3]\\ [G_1\ \ 0]\\ [0\ \ G_1]\end{matrix} = [C|C+C_1] = [C_2]$$

From this equation, several things can be seen. The lengths of data bits $d_a$, $d_b$, and $d_c$ are $k_3$, $k_1$, and $k_1$ respectively. Data bits $d_a$ affect both halves of the code words $C_2$ and should therefore have increased error protection. Data bits $d_a$ and $d_b$ generate the left half of the code words $C_2$. Data bits $d_a$ and $d_c$ generate the right half of the code words $C_2$. The decomposition of the generator matrix $G_2$ to include the two zero or empty submatrices provides this separation of the right and left halves of the code word and simplifies decoding as explained below. In the present embodiment, data word $d_2$ is six bits long and therefore has 64 possible values. Therefore, there are 64 code words in $C_2$.

In the embodiment which has been described above, the encoder 14 receives six bit digital words and generates sixteen bit code words for transmission by transmitter 16. When receiver 22 receives the transmitted signals corrupted by noise source 20, it will produce sixteen bit received signal vectors y which include errors and therefore do not exactly match any of the allowable code words in $C_2$. A standard decoding technique is to find the code word $C_2$ which has the minimum squared Euclidean distance D to the vector y. This may be expressed as:

$$D = \Sigma(y_i - c_i)^2$$

A straightforward way to do this is the exhaustive search approach. This involves calculating the distance D from every allowable code word $C_2$ to each received signal vector y, comparing the values of D and selecting the codeword $C_2$ having the smallest value as the correct code word. The data word which corresponds to the selected code word would then be selected as the transmitted data word. In the present embodiment having sixty-four sixteen-bit code words, the exhaustive search approach would require making sixty-four distance calculations of sixteen bit words and comparing the sixty-four results to find the smallest. It can be seen that a considerable amount of hardware may be required to perform such a decoding function and it could slow overall system operating speed. As the data word size is increased and the code word size is increased proportionally, the exhaustive search approach requires dramatically more hardware and can cause unacceptable time delays in decoding.

The codes generated according to the present invention allow the decoding process to be broken down into smaller decoding steps which may be performed in parallel, i.e. simultaneously. The result is that less hardware and time are required.

The received signal vector, y, provided by receiver 22 is first broken into left and right halves, $y_L$, and $y_R$. In the present embodiment where each code word $C_2$ is sixteen bits long, each half word is therefore eight bits long. The left code words are from the code word set C and the right code words are from the code word set $C+C_1$. Due to the way the generator matrix $G_2$ has been designed, each half of the received signal y may be decoded independently of the other and therefore may be decoded simultaneously.

FIG. 2 is a block diagram of a simplified decoder made possible by the present invention and illustrates the parallel nature of the decoder. In FIG. 2 there are four decoder sections 30, 32, 34, 36, each of which is also identified by the letters A, B, C, and D respectively. Decoder section 30 includes a left half decoder unit A (LHDU-A) 38 and a right half decoder unit A (RHDU-A) 40. In similar fashion, decoder section 32 includes left and right half decoder units 42, 44; decoder section 34 includes left and right half decoder units 46, 48; and decoder section 36 includes left and right half decoder units 50, 52. The received signal left half, $y_L$, is coupled to each of the left half decoders 38, 42, 46, and 50. The received signal right half, $y_R$, is coupled to each of the right half decoders 40, 44, 48, and 52. The outputs of the two halves 38, and 40 of decoder section 30 are coupled to an adder 54. In similar fashion, adders 56, 58 and 60 are provided to add the right and left half signals for each of the decoder sections 32, 34 and 36. The outputs of all adders 54, 56, 58 and 60 are coupled to a comparator 62.

In the present embodiment, four decoder sections are used because the first part $d_a$ of the data word $d_2$ has a length of two bits. Therefore $d_a$ has four possible digital values: 00, 01, 10 and 11. Each of the four data sections assumes one of these four values and decodes for the other possible values of the right and left halves of the code words.

LHDU-A 38 assumes that the value of $d_a$ is 00 and finds the value of $d_b$ which minimizes the value of the distance D:

$$D = \|y_L - C\|^2 = \|y_L - [00 \mid d_b][G_3]\|^2$$
$$[G_1]$$

LHDU-B 42 assumes that the value of $d_a$ is 01 and finds the value of $d_b$ which minimizes the value of:

$$D = \|y_L - C\|^2 = \|y_L - [01 \mid d_b][G_3]\|^2$$
$$[G_1]$$

LHDU-C 46 assumes that the value of $d_a$ is 10 and finds the value of $d_b$ which minimizes the value of:

$$D = \|y_L - C\|^2 = \|y_L - [10 \mid d_b][G_3]\|^2$$
$$[G_1]$$

LHDU-D 50 assumes that the value of $d_a$ is 11 and finds the value of $d_b$ which minimizes the value of:

$$D = \|y_L - C\|^2 = \|y_L - [11 \mid d_b][G_3]\|^2$$
$$[G_1]$$

Since $d_b$ is two bits long, it has four possible values. Each of these comparisons therefore require comparison of only four eight-bit code words to the left half of the received signal vector. Note that C is a code word of the original code word set and therefore has a length of eight bits in this embodiment. Each of the decoder units 38, 42, 46 and 50 may perform its four distance calculations and selection of the smallest distance simultaneously. The outputs of each of these left half units includes the minimum calculated distance and the identity of the particular $d_b$ which corresponds to the calculated distance.

RHDU-A 40 assumes that the value of $d_a$ is 00 and finds the value of $d_c$ which minimizes the value of D:

$$D = \|y_R - [C + C_1]\|^2 = \|y_R - [00 \mid d_c][G_3]\|^2$$
$$[G_1]$$

RHDU-B 44 assumes that the value of $d_a$ is 01 and finds the value of $d_c$ which minimizes the value of:

$$D = \|y_L - [C + C_1]\|^2 = \|y_R - [01 \mid d_c][G_3]\|^2$$
$$[G_1]$$

RHDU-C 48 assumes that the value of $d_a$ is 10 and finds the value of $d_c$ which minimizes the value of:

$$D = \|y_L - [C + C_1]\|^2 = \|y_L - [10|d_c][G_3]\|^2$$
$$[G_1]$$

RHDU-D 52 assumes that the value of $d_a$ is 11 and finds the value of $d_c$ which minimizes the value of:

$$D = \|y_L - [C + C_1]\|^2 = \|y_L - [11|d_c][G_3]\|^2$$
$$[G_1]$$

Since $d_c$ is two bits long, it has four possible values. Each of these comparisons therefore require comparison of only four eight-bit code words to the right half of the received signal vector. Each of the decoder units 40, 44, 48 and 52 may perform its four distance calculations and selection of the smallest distance simultaneously and at the same time the left half calculations are made. The outputs of each of these right half units includes the minimum calculated distance and the identity of the particular $d_c$ which corresponds to the calculated distance.

In the present embodiment, it should be noted that the right half and left half decoder units, e.g. 38 and 40, are identical. The data word sections $d_b$ and $d_c$ are each two bits long and therefore have the same four possible digital values. Both $d_b$ and $d_c$ are multiplied by subcode generator matrix $[G_1]$, to determine the possible code words for the distance D calculation.

As shown in FIG. 2, the left and right half outputs for each decoder section 30, 32, 34 and 36 are combined in adders 54, 56, 58 and 60. The adders sum the smallest distances D calculated in each pair of decoder units and couple the sums to comparator 62. Comparator 62 picks the smallest input to identify the correct codeword and transmitted data word for the received signal vector y. Since each decoder section 30, 32, 34 and 36 corresponds to one of the four possible values of $d_a$, the comparator 62 automatically knows the proper value for $d_a$. That is, if the output of adder 56 is the smallest, the value of $d_a$ is 01. In addition to providing the distance values D, each of the decoder sections keeps track of the values of $d_b$ and $d_0$ which correspond to the smallest D values calculated. When comparator 62 picks the section with the smallest combined D value, it therefore also picks the values of $d_b$ and $d_c$ identified by the respective decoder unit as the proper data word values. The combined $d_a$, $d_b$ and $d_c$ is therefore picked as the correct transmitted data word $d_2$ and is provided on output 64, which is coupled to the input of digital to analog converter 26 of FIG. 1.

In the above-described process of designing a new generator matrix from an existing block code, a decomposition process was used once. That is, a subcode of the original code was selected and concatenated with the original code. The decomposition process can be applied again to the new generator matrix $G_2$ one or more times. That is, a subcode of $G_2$ may be selected and concatenated with $G_2$ and decomposed as described above. For each application of the decomposition process, further levels of unequal error protection may be provided and the decoding process can be decomposed into more levels of parallel decoding. In the embodiment described herein, each half decoding unit, e.g. 38, is required to make only four distance D calculations and pick the smallest as its output. If the length of the data word, and corresponding code word, is increased, the number of calculations and comparisons increases. According to the present invention, the number of decompositions of the generator matrix is also increased to keep the number of distance calculations required by each data unit to a small value to speed the decoding process.

While the present invention has been illustrated and described in terms of particular apparatus and methods of use, it is apparent that equivalent parts and step may be substituted for those shown and other changes can be made whitin the scope of the present invention as defined by the appended claims.

What is claimed is:

1. A method for designing an unequal error protection block code comprising;

selecting a first linear block code, generating a subcode of the block code, generating a second block code by concatenating the first linear block code with the sum of itself and the subcode, generating a generator matrix for said second block code, and decomposing the generator matrix to include empty submatrices.

2. The method of claim 1 further comprising;

generating a subcode of the second block code, generating a third block code by concatenating the second linear block code with the sum of itself and the subcode of the second block code, generating a generator matrix for said third block code, and decomposing the generator matrix for said third block code to include empty submatrices.

3. The method of claim 1 wherein:

said first linear block code is a Reed-Muller code.

4. The method of claim 1 wherein:

said first linear block code has a generator matrix G, said subcode has a generator matrix $G_1$, and said step of decomposing comprises generating a code comprising the set of representatives of the cosets of said subcode in said first linear block code and having a generator matrix $G_3$.

5. The method of claim 4 wherein:

$$[G] = [G_3]$$
$$[G_1].$$

6. The method of claim 5 wherein:

said second block code has a generator matrix G2 and $$[G_2] = [G \quad G]$$
$$[0 \quad G_1]$$

and is decomposed by rewriting as $$[G_2] = [G_3 \quad G_3]$$
$$[G_1 \quad G_1]$$
$$[0 \quad G_1]$$

and then subtracting the last row of submatrices from the second row of submatrices to provide a decomposition of $G_2$ having two empty submatrices as follows $$[G_2] = [G_3 \quad G_3]$$
$$[G_1 \quad 0]$$
$$[0 \quad G_1].$$

7. A digital communications system comprising:
an encoder configured to receive a digital signal and convert said digital signal to a digital codeword,
said encoder including an error protection code generator matrix having the form:

$$[G_3 \; G_3]$$
$$[G_1 \; 0]$$
$$[0 \; G_1]$$

wherein $G_1$ is a generator matrix for a subcode $C_1$ of a block code C and $G_3$ is a generator matrix for the set of representatives of the cosets of $C_1$ in C.

8. The digital communications system of claim 7 wherein:
said block code C is a Reed-Muller code.

9. The system according to claim 7 further comprising:
a means for sending said code words through a transmission channel.

10. The system according to claim 9 further comprising;
means coupled to said transmission channel for receiving said code words,
means for dividing received code words into a plurality of sections, and
means for simultaneously decoding each code word section.

11. The system according to claim 10 wherein:
$[G_3]$ has $k_3$ rows and n columns,
$[G_1]$ has $k_1$ rows and n columns,
the digital signal has a length of $k_3$ plus two times $k_1$ and is subdivided into three parts $d_a$, $d_b$ and $d_c$ having lengths of $k_3$, $k_1$, and $k_1$ respectively, the codeword has a length of 2n, and is divided into a left half and a right half,
further comprising;
$2^{k_3}$ decoding sections, each section assuming one of the $2^{k_3}$ possible values of $d_a$ and each section including a right half and left half decoding unit and an adder,
each left half decoding unit selecting the value of $d_b$ which provides the minimum squared Euclidian distance between the received codeword left half and code words corresponding to the assumed value of $d_a$ and all possible values of $d_b$,
each right half decoding unit selecting the value of $d_c$ which provides the minimum squared Euclidian distance between the received codeword right half and code words corresponding to the assumed value of $d_a$ and all possible values of $d_c$,
each adder summing the minimum squared Euclidian distances provided by the left half and right half decoder units of its section,
a comparator coupled to all of said adders selecting the minimum output of all adders as identifying the correct code word corresponding to the received code word.

12. An error protection code generator matrix having the form:

$$[G_3 \; G_3]$$
$$[G_1 \; 0]$$
$$[0 \; G_1]$$

wherein $G_1$ is a generator matrix for a subcode $C_1$ of a block code C and $G_3$ is a generator matrix for the set of representatives of the cosets of $C_1$ in C.

13. The error protection code generator matrix of claim 12 wherein:
the block code C has a generator matrix G and $$[G] = [G_3]$$
$$[G_1].$$

14. A method for communicating digital signals with error protection comprising:
selecting a first linear block code,
generating a subcode of the block code,
generating a second block code by concatenating the first linear block code with the sum of itself and the subcode,
generating a generator matrix for said second block code,
decomposing the generator matrix to include empty submatrices, and
encoding a digital data word with said generator matrix including empty submatrices to produce a code word.

15. A method according to claim 14 further including:
dividing said code word into a right half and a left half and simultaneously decoding each half.

16. A method according to claim 14 wherein:
said generator matrix including empty submatrices has $k_3$ plus two times $k_1$ rows and n columns,
said data word has a length of $k_3$ plus two times $k_1$ and is subdivided into three parts $d_a$, $d_b$ and $d_c$ having lengths of $k_3$, $k_1$, and $k_1$ respectively,
said codeword has a length of 2n, and is divided into a left half and a right half,
further comprising the steps of,
for each of the $2^{k_3}$ values of $d_a$, selecting the value of $d_b$ which provides the minimum squared Euclidian distance between the received codeword left half and code words corresponding to the assumed value of $d_a$ and all possible values of $d_b$,
for each of the $2^{k_3}$ values of $d_a$, selecting the value of $d_c$ which provides the minimum squared Euclidian distance between the received codeword right half and code words corresponding to the assumed value of $d_a$ and all possible values of $d_c$, and
for each of the $2^{k_3}$ values of $d_a$, summing the minimum squared Euclidian distances for the selected values of $d_b$ and $d_c$ and selecting values of $d_a$, $d_b$ and $d_c$ which correspond to the minimum sum as the correct data word for the code word.

17. A method for communicating digital signals with error protection comprising:
decoding a codeword having a length of 2n which has been generated by encoding a data word comprising three parts $d_a$, $d_b$ and $d_c$ having lengths of $k_3$, $k_1$, and $k_1$, respectively, with a generator matrix including empty submatrices and having $k_3$ plus two times $k_1$ rows and n columns by the steps of;

for each of the $2^{k_3}$ values of $d_a$, selecting the value of $d_b$ which provides the minimum squared Euclidian distance between the received codeword left half and code words corresponding to the assumed value of $d_a$ and all possible values of $d_b$, for each of the $2^{k_3}$ values of $d_a$, selecting the value of $d_c$ which provides the minimum squared Euclidian distance between the received codeword right half and code words corresponding to the assumed value of $d_a$ and all possible values of $d_c$, and for each of the $2^{k_3}$ values of $d_a$, summing the minimum squared Euclidian distances for the selected values of $d_b$ and $d_c$ and selecting values of $d_a$, $d_b$ and $d_c$ which correspond to the minimum sum as the correct data word for the code word.

18. A method according to claim 17 wherein:

said generator matrix is generated by the steps of selecting a first linear block code, generating a subcode of the block code, generating a second block code by concatenating the first linear block code with the sum of itself and the subcode, generating a generator matrix for said second block code, and decomposing the generator matrix to include empty submatrices.

19. A method according to claim 18 wherein:

said first linear block code is a Reed-Muller code.

20. A method according to claim 17 wherein said matrix has the form:

$$[G_3 \ G_3]$$

$$[G_1 \ 0]$$

$$[0 \ G_1]$$

wherein $G_1$ is a generator matrix for a subcode $C_1$ of a block code C and $G_3$ is a generator matrix for the set of repersentative of the consets of $C_1$ in C.

* * * * *